United States Patent [19]
Jean et al.

[11] Patent Number: 6,118,991
[45] Date of Patent: Sep. 12, 2000

[54] DEVICE INCLUDING A BROADBAND AMPLIFIER CIRCUIT

[75] Inventors: Patrick Jean, Orsay; Isabelle Rousseau, Paris, both of France

[73] Assignee: U.S. Philips Corporation, New York, N.Y.

[21] Appl. No.: 09/070,984

[22] Filed: May 1, 1998

[30] Foreign Application Priority Data

May 7, 1997 [FR] France ..................................... 9705670

[51] Int. Cl.$^7$ ............................... H04B 1/16; H03F 3/04
[52] U.S. Cl. .......................... 455/293; 455/341; 330/310; 330/100
[58] Field of Search .................................... 330/310, 311, 330/98, 99, 100, 253, 307; 455/313, 291, 293, 341

[56] References Cited

U.S. PATENT DOCUMENTS

| | | | |
|---|---|---|---|
| 4,071,830 | 1/1978 | Huntington | 330/277 |
| 4,647,872 | 3/1987 | Johnson | 330/311 |
| 4,811,424 | 3/1989 | Cox | 455/260 |
| 5,017,884 | 5/1991 | Perandi | 330/3 |
| 5,745,009 | 4/1998 | Leroux | 330/277 |
| 5,994,960 | 11/1999 | Baschirotto | 330/253 |
| 5,994,963 | 11/1999 | Kawai | 330/277 |

*Primary Examiner*—Daniel S. Hunter
*Assistant Examiner*—Nick Corsaro
*Attorney, Agent, or Firm*—Dicran Halajian

[57] ABSTRACT

A device having a broadband amplifier circuit is disclosed in which the amplifier circuit includes at least two field effect transistor stages with low transistors arranged as amplifiers and high transistors arranged as load transistors. The device has several stages where the output signal of a given stage other than the first stage is caused to be fed back to its own input through a feedback branch including at least the high transistor of the stage preceding the given stage.

15 Claims, 2 Drawing Sheets

DEVICE INCLUDING A BROADBAND AMPLIFIER CIRCUIT

FIELD OF THE INVENTION

The invention relates to a device including a broadband amplifier circuit.

The invention finds its application in the field of manufacturing cordless and/or corded telecommunication receiving and/or transmitting devices.

BACKGROUND OF THE INVENTION

A broadband amplifier is already known from the publication: IEEE JOURNAL OF SOLID STATE CIRCUITS, VOL. SC-16, NO. 6, DECEMBER 1981 "A GaAs Monolithic Low-noise Broadband Amplifier", John A. ARCHER, Herbert P. WEIDLICH et al.

This publication describes a broadband amplifier which forms a GaAs monolithically integrated circuit. This amplifier circuit comprises two stages which have each an amplifier transistor and a load transistor. The transistors are all of the type that is normally on when there is no gate-source bias voltage. The balance voltage strongly depends on the similitude of the amplifier and load transistors, thus said transistors are identical in each stage and biased with a zero gate-source voltage. For this purpose, on the one hand, the source of the amplifier transistors is connected to ground and their gate is connected to ground through a resistor and, on the other hand, the source and the gate of the load transistors are interconnected and connected to the drain of the amplifier transistors. The circuit further includes in each stage a feedback resistor connected between the drain and the gate of the amplifier transistor of said stage. In this circuit it has been found that the voltage available on the drain of each amplifier transistor is extremely sensitive to the match of the amplifier and load transistors, which leads to a problem when the circuit is to be manufactured in large series, because under these circumstances the characteristic features of the transistors are generally dispersed. Thus the risk is manufacturing losses.

SUMMARY OF THE INVENTION

It is an object of the invention to provide a device which includes a broadband amplifier circuit which solves various problems, among which:

being insensitive to the matching of the amplifier and load transistors to create the possibility of being included in devices manufactured in large series;

having a very large DC gain for allowing the transistors to be biased with simple bias means;

having a very flat frequency response.

According to the invention these problems are solved by a device which includes a broadband amplifier circuit in which the amplifier circuit comprises at least two field effect transistor stages, with low transistors arranged as amplifiers and high transistors arranged as loads, and in which the output signal of a given stage other than the first stage is fed back to its own input through a feedback branch which comprises at least said high transistor of the stage preceding said given stage.

This device inter alia has the advantages that the gain variation of the amplifier as a function of temperature is extremely little compared with the variations habitually found in known amplifiers and that the variations of its gain as a function of the dispersions of the characteristics of the elements of the circuit during manufacturing are very small.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
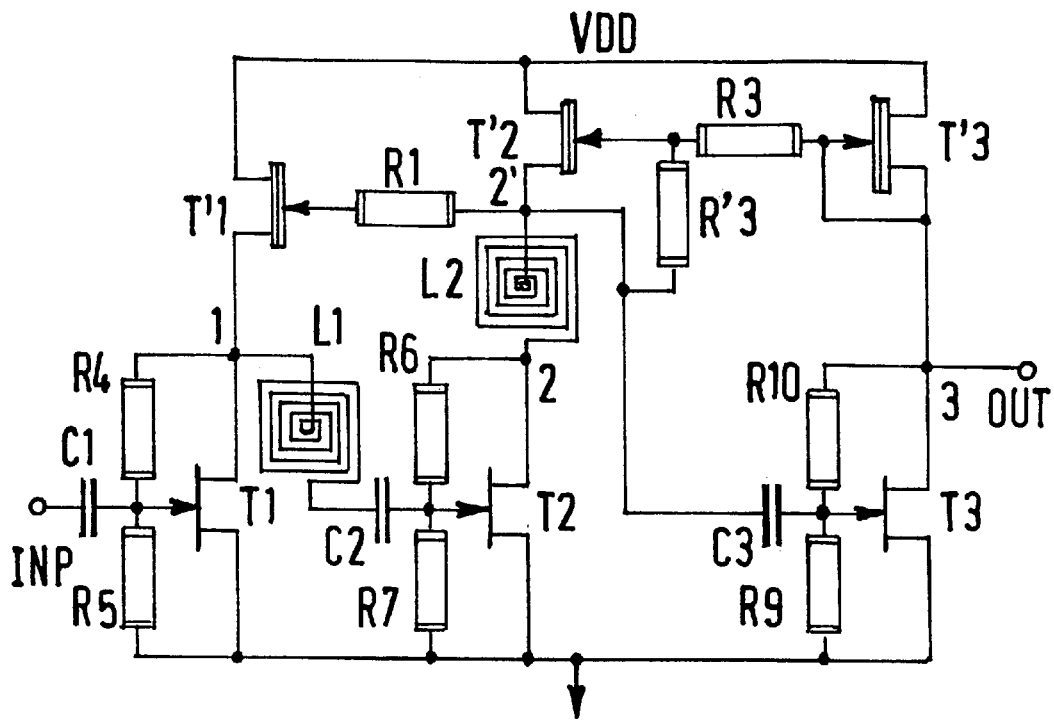
FIG. 1 and FIG. 2 represent a first and a second example respectively, of the amplifier circuit.

Reference is made to FIG. 1, in a first embodiment given by way of example, in which an amplifier circuit 100 comprises three series-connected amplifier stages. The three stages comprise a low transistor T1, T2, T3 and a high transistor T'1, T'2, T'3 respectively, connected between ground and a DC voltage supply VDD. The transistors are field effect transistors having each a gate, a source and a drain electrode. Said low transistors T1, T2, T3, which have the function of amplifier, are of the type called N-OFF which are off when there is no gate-source bias voltage. Said high transistors T'1, T'2, T'3, which have the function of load, are of the type called N-ON which are on when there is no gate-source bias voltage. The difference between the low and high transistors which are the N-OFF and N-ON transistors respectively, is an important technical feature of the invention.

In the circuit shown in FIG. 1, the first amplifier stage comprises the low N-OFF transistor T1 whose source is connected to ground, whose gate receives an AC input signal on the node INP through a D.C. isolating capacitor C1 and whose drain is connected at the node 1 to the source of the high N-ON transistor T'1. This high N-ON transistor T'1 working as a load has its drain connected to the DC power supply VDD and its source connected at node 1 to the drain of the low transistor T1. Furthermore, resistors R4, R5 are arranged as a resistor bridge between the drain 1, the gate and the grounded source of the low transistor T1 to ensure the biasing of the gate.

In the circuit shown in FIG. 1, the second amplifier stage comprises a low N-OFF transistor T2 whose source is connected to ground, whose gate receives the AC output signal of the first stage available at the node 1 and applied to said gate of the low transistor T2 through a self-inductance element L1 and a DC isolating capacitor C2. The high transistor T'2 works as a load and has its drain connected to the DC power supply VDD and its source connected to the drain of the low transistor T2 via a self-inductance element L2 located between a node 2' to the source of the transistor T'2 and a node 2 to the drain of the transistor T2. Bias resistors R6, R7 are arranged as a resistor bridge between the drain 2, the gate and the grounded source of the low transistor T2 to ensure its biasing of the gate.

Furthermore, a resistor R1 is connected between the source 2' of the high transistor T'2 of the second stage and the gate of the high transistor T'1 of the first stage, so that the output signal of the second stage, which is available on the drain of the low transistor T2 at node 2, is led at node 1 to the drain of the low transistor T1 of the first stage, through said self-inductance element L2, said resistor R1 and said high transistor T'1 of the first stage.

This high transistor T'1 of the first stage thus partly has an active function of load and partly a feedback function. On the one hand, this high transistor T'1 forms part of the feedback loop including L2 and R1, and on the other hand it forms a load for the low transistor T1, which load is controlled by the output signal of the second stage available at node 2.

In the circuit shown in FIG. 1, the third stage comprises the low N-OFF transistor T3 whose source is connected to ground, whose gate receives the AC output signal of the second stage available at node 2 and applied to said gate of the low transistor T3 through, on the one hand, said self-inductance element L2 which is arranged between the nodes 2 and 2' of the second stage, and through a DC isolating capacitor C3 on the other hand. The high transistor T'3 has its drain connected to the DC power supply VDD and its source connected to the drain of the low transistor T3. Bias resistors R10, R9 are arranged as a resistor bridge between the drain 3, the gate and the grounded source of the low transistor T3 to ensure its gate biasing. There will be noted the particular phenomenon caused by the fact that the signal is tapped from the third stage by means of the series-arranged self-inductance element L2 instead of an inter-stage self-inductance element such as L1. This particular phenomenon makes it possible to obtain a flatter frequency response for the amplifier.

Moreover, the high transistor T'3 has its gate connected directly to its source to form a real active load in the customary technical meaning for the low transistor T3. Besides, a resistor R3 is connected between the drain 3 of the low transistor T3 and the gate of the high transistor T'2. The output signal of the third stage, which is available on the drain of the low transistor T3 at the node 3 is returned to the drain of the low transistor T2 of the second stage at node 2 through said resistor R3 and said high transistor T'2 of the second stage.

This high transistor T'2 of the second stage thus partly has a function of load and partly a function of feedback. On the one hand, this high transistor T'2 forms part of the feedback loop which includes R3 and L2, and on the other hand, it forms a load for the low transistor T2, whereas this load is controlled by the output signal of the third stage available at node 3. The feedback ratio between the third and the second stage is not exactly equal to 1, because this feedback ratio is controlled by the resistor bridge R3, R'3 which forms a voltage divider. Thus, the feedback ratio is adjusted as a function of the values of these resistors, to obtain a cut-off frequency suitable for the amplifier. On the other hand, the feedback ratio of the second stage relative to the first stage is controlled by realizing the load of the first stage.

The last stage T3 has a pure active load, for example, if there is no fourth stage for providing a feedback connected to the third stage. It is advantageous for the operation of the amplifier circuit to have at least one amplifier stage that has a real active load which determines the drain bias voltage of the low transistor of the stage under discussion and also that of the other amplifier stages.

In a generalization of the invention, an amplifier circuit has at least two successive amplifier stages of which the second stage produces a feedback linked to the first stage. Thus, in the example described above, the two first stages have a load which also has a role of feedback. The function of such a feedback loop is to lead to the drain of a transistor of a preceding stage an anti-phase signal which is available on the drain of a given stage so as to be able to apply this signal again to the gate of said given transistor. Thus, in the transistor of the second stage, the gate is supplied with a signal coming from the drain of said transistor and being an anti-phase signal compared to the signal normally arriving at said gate. Indeed, the output of the low transistor T1, on its drain at node 1, is transmitted to the input of the low transistor T2 on its gate. Then, the output signal of the low transistor T2 is retransmitted to the input of this same transistor T2 via the high transistor T'1 working as a follower transistor. In the on-mode, the low transistor T1 amplifies the signal carried on its input INP, but does not act in the feedback mode. Indeed, the feedback is applied to the output of the first stage. Such a circuit formed by means of the two stages T1, T'1 and T2, T'2 respectively, forms a flat-gain amplifier.

In the feedback arrangement in the amplifier circuit 100, there may be provided a different high frequency and low frequency feedback. For this purpose, one takes the fact into account that the gain of the amplifier spontaneously diminishes when the frequency increases because the input impedance which is equivalent to a capacitance forms an R-C filter with the loads. When the values of the various elements of the circuit are calculated in a precise manner known to those of ordinary skill in the art, the matrix of the feedback values in the various stages will be obtained. It is thus advantageous to provide the values of said elements so that the feedbacks are high at BF and less high at HF. The result is the advantage that the amplifier circuit shows a flatter gain over a larger frequency bandwidth. For diminishing the feedback at HF, it is favorable to calculate the values of the elements for constructing stages where the feedback signal arrives not completely as anti-phase values, but with another predetermined phase difference, for example, as quadrature values.

In the circuit shown in FIG. 1, the feedback ratio of the second stage relative to the first stage is near to 1 in the meaning of the attenuation. But this ratio 1 is not a real ratio because if it were different, the amplifier would not show any gain, which is not the case. The feedback ratio between the first and the second stage of FIG. 1 depends on the transconductance of the high transistors T'1 and T'2.

It will be noted that together with the input capacitance of the high transistor T'1, the resistor R1 forms a controlled low-pass filter R-C for improving the passband. On the other hand, the self-inductance elements L1 and L2 are attuned to the input capacitors of the low transistors.

Figure 2:
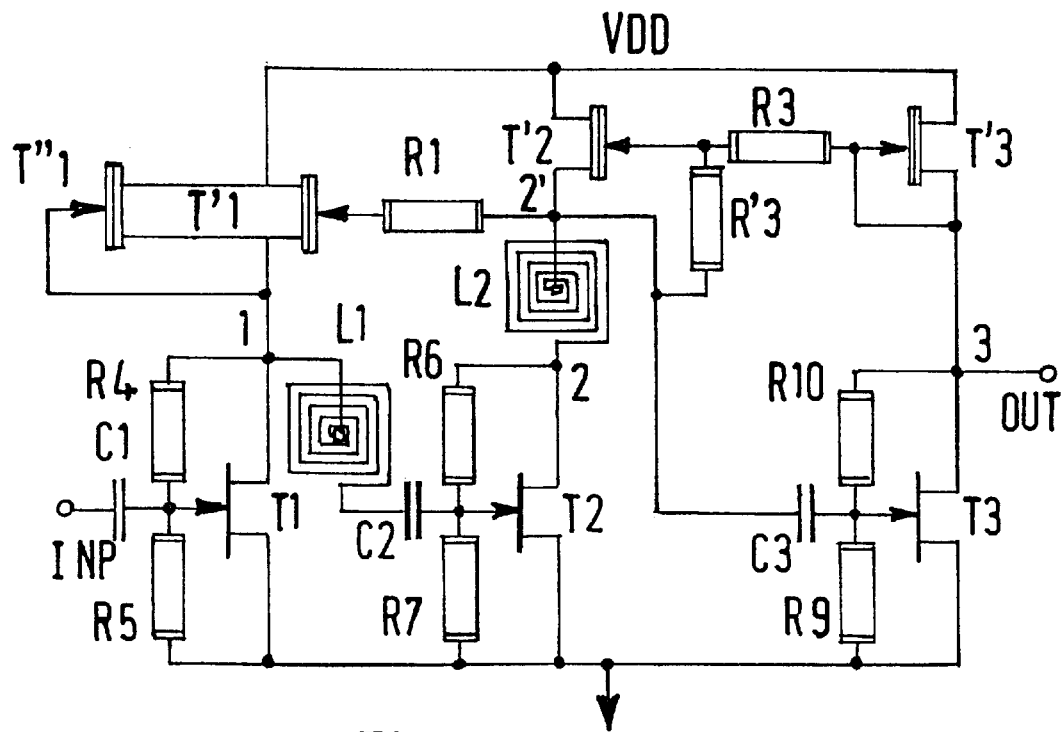

With reference to FIG. 2, the flat gain amplifier 100 of FIG. 1 is modified in that the high transistor of the first stage is split up into two transistors which have common drains and sources. One of these two transistors, denoted T'1, is arranged exactly like the transistor T'1 of FIG. 1 and has in the case of the circuit of FIG. 2 only the function of participating in the feedback described above. The second of these two transistors, denoted T"1, has only a function of load and therefore its gate is connected to its source. Still in this circuit of FIG. 2, all the low transistors are of a type that is different from those of the high transistors. With a positive power supply VDD, the low transistors are of the N-OFF type and the high transistors of the N-ON type. The use of a positive power supply VDD is particularly advantageous when a circuit 100 is included in a portable or cordless device powered by batteries.

In the circuit of FIG. 2, the feedback ratio depends on the size of the feedback transistor T'1. In a favorable example, the sizes of the transistors T'1 and T"1 are substantially the same and in that case the feedback ratio is near to 0.5. An advantage of the amplifier circuits 100 of FIGS. 1 and 2 is that the DC gain is very large, about 10, which makes it possible to realize the biasing of the stages with simple means formed by resistor bridges.

Figure 3:
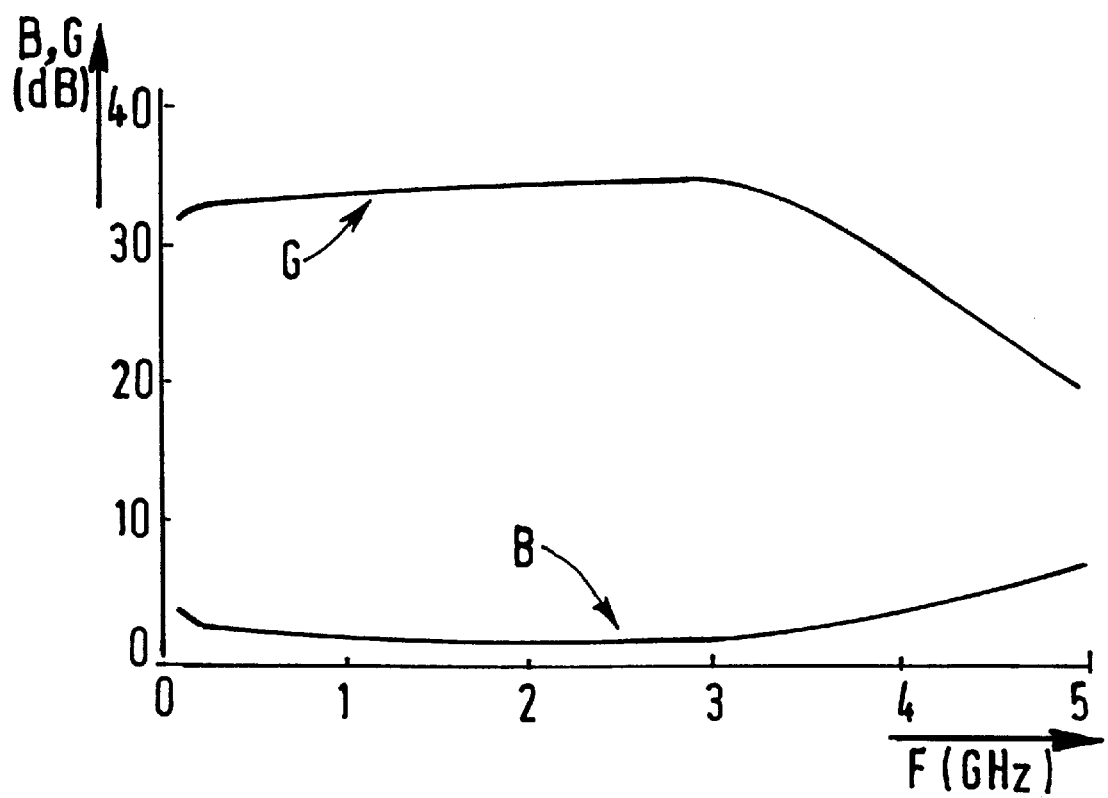
FIG. 3 represents a gain curve G and a noise factor curve B as a function of frequency F.

The circuits of FIGS. 1 and 2 could function with high and low transistors of the same type, but they would not have a substantial gain. With reference to FIG. 3, the amplifier circuit 100 of FIG. 2 shows a flat gain G of about 35 dB between several Hz and 3 GHz, and a gain of more than 20 dB up to 5 GHz. This circuit shows a low and very constant noise factor B in the same frequency range F.

Figure 4:
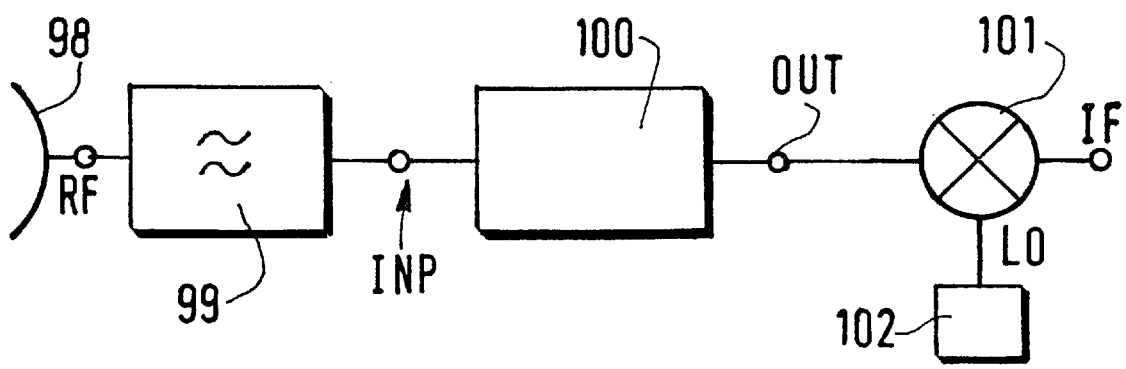
FIG. 4 represents a telecommunication device including such an amplifier circuit.

An amplifier circuit 100 as described above is included in a telecommunications device. By way of example, FIG. 4 shows a radio frequency receiving device which comprises: a radio frequency filter 99 receiving a signal RF coming from an antenna 98 and connected to the input INP of the amplifier 100; the amplifier circuit 100 having an output denoted OUT; and a mixer 101 receiving on the input the output signal OUT of the amplifier 100 and a signal LO of a local oscillator 102 and producing an output signal having an intermediate frequency IF. A device including such an amplifier circuit 100 shows among other advantages little dispersion as a function of frequency and as a function of temperature, and a very constant noise factor.

What is claimed is:

1. A device including a broadband amplifier circuit, said broadband amplifier circuit comprising at least two field effect transistor stages having a first set of transistors arranged as amplifiers and a second set of transistors arranged as loads, wherein an output signal of a given stage other than a first stage of said at least two field effect transistor stages is fed back to an input of said given stage through a feedback branch which comprises at least one transistor from said second set of transistors of a preceding stage preceding said given stage, wherein said at least one transistor of said preceding stage is double, having a first transistor part entering said feedback branch and a second transistor part providing a load function.

2. A device as claimed in claim 1, wherein said second set of transistors (T1, T2) of the broadband amplifier circuit include transistors which are different from transistors of said first set of transistors.

3. A device as claimed in claim 1, wherein said at least one transistor of said preceding stage entering said feedback branch is a sole transmitter to ensure the load function.

4. A device including a broadband amplifier circuit, said broadband amplifier circuit comprising at least two field effect transistor stages having a first set of transistors arranged as amplifiers and a second set of transistors arranged as loads, wherein an output signal of a given stage other than a first stage of said at least two field effect transistor stages is fed back to an input of said given stage through a feedback branch which comprises at least one transistor from said second set of transistors of a preceding stage preceding said given stage, wherein said feedback branch includes self-impedance elements which are attuned to input impedances of the first set of transistors to ensure a flatter frequency response of the broadband amplifier circuit.

5. A device including a broadband amplifier circuit, said broadband amplifier circuit comprising at least two field effect transistor stages having a first set of transistors arranged as amplifiers and a second set of transistors arranged as loads, wherein an output signal of a given stage other than a first stage of said at least two field effect transistor stages is fed back to an input of said given stage through a feedback branch which comprises at least one transistor from said second set of transistors of a preceding stage preceding said given stage, wherein a resistor bridge is inserted between a drain, a gate and a grounded source of the first set of transistors to ensure biasing of the gate.

6. A device including a broadband amplifier circuit, said broadband amplifier circuit comprising at least two field effect transistor stages having a first set of transistors arranged as amplifiers and a second set of transistors arranged as loads, wherein an output signal of a given stage other than a first stage of said at least two field effect transistor stages is fed back to an input of said given stage through a feedback branch which comprises at least one transistor from said second set of transistors of a preceding stage preceding said given stage, wherein said broadband amplifier circuit includes three amplifier stages with two successive stages connected by said feedback branch and with one stage having a real active load formed by one of said second set of transistors.

7. A device as claimed in claim 6, further comprising a resistor bridge which is a voltage divider inserted into said feedback branch to control a feedback ratio.

8. A telecommunications device including the device of claim 1.

9. A radio frequency receiver including the device of claim 1, further comprising a radio frequency filter which receives a signal coming from an antenna and is connected to an input of the broadband amplifier circuit; and a mixer circuit which receive an amplified output signal of the broadband amplifier circuit and a signal of a local oscillator to produce an intermediate frequency signal.

10. A telecommunications device including the device of claim 4.

11. A telecommunications device including the device of claim 5.

12. A telecommunications device including the device of claim 6.

13. A radio frequency receiver including the device of claim 4, further comprising a radio frequency filter which receives a signal coming from an antenna and is connected to an input of the broadband amplifier circuit; and a mixer circuit which receives an amplified output signal of the broadband amplifier circuit and a signal of a local oscillator to produce an intermediate frequency signal.

14. A radio frequency receiver including the device of claim 5, further comprising a radio frequency filter which receives a signal coming from an antenna and is connected to an input of the broadband amplifier circuit; and a mixer circuit which receives an amplified output signal of the broadband amplifier circuit and a signal of a local oscillator to produce an intermediate frequency signal.

15. A radio frequency receiver including the device of claim 6, further comprising a radio frequency filter which receives a signal coming from an antenna and is connected to an input of the broadband amplifier circuit; and a mixer circuit which receives an amplified output signal of the broadband amplifier circuit and a signal of a local oscillator to produce an intermediate frequency signal.

* * * * *